(12) United States Patent
Umezaki

(10) Patent No.: US 7,733,316 B2
(45) Date of Patent: Jun. 8, 2010

(54) DISPLAY DEVICE, DRIVING METHOD THEREOF AND ELECTRONIC APPLIANCE

(75) Inventor: Atsushi Umezaki, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1172 days.

(21) Appl. No.: 11/338,504

(22) Filed: Jan. 24, 2006

(65) Prior Publication Data

US 2006/0170635 A1  Aug. 3, 2006

(30) Foreign Application Priority Data

Jan. 31, 2005 (JP) ............................ 2005-024616

(51) Int. Cl.
    *G09G 3/36* (2006.01)
(52) U.S. Cl. ........................................ 345/92
(58) Field of Classification Search ................... 345/55, 345/92, 76; 315/169.3, 169.2
    See application file for complete search history.

(56) References Cited

U.S. PATENT DOCUMENTS

| 6,246,180 | B1  |   | 6/2001 | Nishigaki  | ................ | 315/169.3 |
| 6,525,704 | B1  | * | 2/2003 | Kondo et al. | ................ | 345/78 |
| 6,583,775 | B1  |   | 6/2003 | Sekiya et al. | ................ | 345/76 |
| 6,697,057 | B2  | * | 2/2004 | Koyama et al. | ............ | 345/204 |
| 6,781,567 | B2  | * | 8/2004 | Kimura | ........................ | 345/92 |

| 2002/0113760 | A1 | 8/2002 | Kimura | ........................ | 345/82 |

FOREIGN PATENT DOCUMENTS

| EP | 1 061 497    | 12/2000 |
| JP | 2000-221942  | 8/2000  |
| JP | 2000-235370  | 8/2000  |
| JP | 2000-347621  | 12/2000 |
| JP | 2001-042822  | 2/2001  |
| JP | 2001-060076  | 3/2001  |
| JP | 2002-323873  | 11/2002 |

\* cited by examiner

*Primary Examiner*—Richard Hjerpe
*Assistant Examiner*—Shaheda A Abdin
(74) *Attorney, Agent, or Firm*—Husch Blackwell Sanders LLP

(57) ABSTRACT

A display device with high productivity and high display quality and a driving method thereof are provided by suppressing generation of a luminescent spot. A first switching element and a second switching element each of which has a different polarity are disposed in series between a power source line for supplying power to a light-emitting element and a power source line having a potential which is equal to or lower than a threshold voltage of the light-emitting element; one electrode of the light-emitting element is connected to a connecting node of the two switching elements; and in the case where a potential which is equal to or higher than the threshold voltage of the light-emitting element is applied to the light-emitting element regardless of an on/off state of the first switching element, a potential applied to the light-emitting element is set to be lower than the threshold voltage by turning the second switching element on. Thus, generation of a luminescent spot is prevented.

20 Claims, 13 Drawing Sheets

DISPLAY DEVICE, DRIVING METHOD THEREOF AND ELECTRONIC APPLIANCE

BACKGROUND OF THE INVENTION

1. Field of the Invention

The present invention relates to an active matrix display device and a driving method thereof. In particular, the invention relates to a display device having a switching element such as a thin film transistor (hereinafter referred to as TFT) and a light-emitting element in each pixel and the driving method thereof. Further, the invention relates to an electronic appliance using the display device and the driving method thereof.

2. Description of the Related Art

In recent years, the technique for forming TFTs has largely progressed, and is applied and developed to active matrix display devices. Particularly, since the field effect mobility (also referred to as mobility) of a TFT using a polysilicon film as an active layer is higher than that of a conventional TFT using an amorphous silicon film, high-speed operations are enabled. Therefore, a pixel can be controlled by a driver circuit which is formed using a TFT over the same substrate as the pixel. A display device in which various circuits are formed using a TFT which is formed over the same substrate as the pixel has various advantages such as a reduction in manufacturing cost, downsizing, higher increase in yield, and higher throughput.

An active matrix EL display device having an electroluminescence element (hereinafter referred to as EL element) that is a light-emitting element as a display element included in each pixel of a display device has been studied actively. An EL display device is also referred to as an organic EL display (OLED) or an organic light-emitting diode (OLED).

In general, since luminance of an EL element is proportional to a current value of the EL element, an EL display device using an EL element as a display element controls the luminance by a current value. Further, there is also a driving method of controlling the luminance by using the time in which a current flows into an EL element under the condition that a current value of the EL element is constant.

Since the luminance of an EL element is proportional to a current value of the EL element, an EL display device using an EL element as a display element has a problem of off current of a switching element in the case where a power source line is connected to the EL element through the switching element. In order to solve this problem, Patent Document 1 is disclosed.

[Patent Document 1] Japanese Patent Laid-Open No. 2002-323873

If a certain pixel of a display device continuously emits light regardless of a video signal, that is, even if one luminescent spot is generated, the display device is often determined to be defective. On the other hand, if a certain pixel always emits no light regardless of a video signal, that is, if a few dark spots are generated, a display device is not determined to be defective.

Further, a luminescent spot is generated because of such a factor that a short circuit is caused between a source and a drain of a TFT connected to an EL element in series, in which case, potentials of a source electrode or a drain electrode of the TFT has the same level, and an EL element continuously emits light regardless of a potential of a gate electrode of the TFT.

SUMMARY OF THE INVENTION

The invention is made to solve the abovementioned problems and to increase a yield by not generating a luminescent spot but generating a dark spot even if a short circuit is caused between the source and the drain of the TFT connected to the EL element in series.

The invention provides a driving method of a display device having a plurality of pixels each of which includes a light-emitting element, a first TFT for determining the luminance, a second TFT having an opposite channel type to the first TFT, and a power source line, wherein the power source line is connected to one electrode of the light-emitting element through the first TFT, a connecting point between one electrode of the light-emitting element and the first TFT is connected to a wire for setting a potential difference between one electrode and the other electrode of the light-emitting element to be lower than a threshold voltage of the light-emitting element through the second TFT, a luminescent spot is turned to be a dark spot by turning the second TFT on in the case where a short circuit is caused between the source and the drain of the first TFT, and a potential of an anode of the light-emitting element has the same level as the power source line so that a luminescent spot is generated. For example, since the potential difference between one electrode and the other electrode of the light-emitting element becomes lower than the threshold voltage of the light-emitting element by turning the second TFT on, the light-emitting element emits no light. Accordingly, a pixel in which a luminescent spot is generated can be turned to be a dark spot.

A low potential to which the second TFT is connected may be any potential as far as the potential difference between one electrode and the other electrode of the light-emitting element is lower than the threshold voltage of the light-emitting element.

The threshold voltage of the light-emitting element is a potential applied to the light-emitting element when a current starts to flow into the light-emitting element. The light-emitting element receives a current to emit light when a potential equal to or higher than the threshold voltage is applied thereto.

Description is made on a structure of a display device for performing display by the abovementioned driving method.

(The First Structure)

The invention provides a display device having a first wire and a plurality of pixels each of which includes a first switching element, a second switching element, a capacitor including a pair of electrodes, and a light-emitting element including a pair of electrodes, wherein the first wire is connected to one electrode of the light-emitting element through the first switching element and to the other electrode of the light-emitting element through the first switching element and the second switching element, the first switching element and the second switching element are controlled to be turned on/off by a potential held in the capacitor, the second switching element is turned off when the first switching element is turned on, and the second switching element is turned on when the first switching element is turned off.

Further, a terminal of the capacitor, which is connected to the first wire, may be connected to anywhere as far as it is held at a fixed potential during operations. For example, it may be connected to the other electrode of the light-emitting element, or another wire.

(The Second Structure)

The invention provides a display device having a first wire, a second wire and a plurality of pixels each of which includes a first switching element, a second switching element, a capacitor including a pair of electrodes, and a light-emitting element including a pair of electrodes, wherein the first wire is connected to one electrode of the light-emitting element through the first switching element and to the second wire through the first switching element and the second switching element, the first switching element and the second switching element are controlled to be turned on/off by a potential held in the capacitor, the second switching element in turned off when the first switching element is turned on, and the second switching element in turned on when the first switching element is turned off.

Further, a terminal of the capacitor, which is connected to the first wire, may be connected to anywhere as far as it is held at a fixed potential during operations. For example, it may be connected to the other electrode of the light-emitting element, or another wire.

(The Third Structure)

The invention provides a display device having a first wire, a second wire, a third wire and a plurality of pixels each of which includes a first switching element, a second switching element, a third switching element, a capacitor including a pair of electrodes, and a light-emitting element including a pair of electrodes, wherein the first wire is connected to one electrode of the light-emitting element through the first switching element and to the other electrode of the light-emitting element through the first switching element and the second switching element, an electrode for controlling on/off of the first switching element and the second switching element is connected to one electrode of the capacitor and to the second wire through the third switching element in the on state, the other electrode of the capacitor is connected to the first wire, an electrode for controlling on/off of the third switching element is connected to the third wire, the second switching element is turned off when the first switching element is turned on, and the second switching element is turned on when the first switching element is turned off.

Further, a terminal of the capacitor, which is connected to the first wire, may be connected to anywhere as far as it is held at a fixed potential during operations. For example, it may be connected to the other electrode of the light-emitting element, or another wire.

(The Fourth Structure)

The invention provides a display device having a first wire, a second wire, a third wire, a fourth wire and a plurality of pixels each of which includes a first switching element, a second switching element, a third switching element, a capacitor including a pair of electrodes, and a light-emitting element including a pair of electrodes, wherein the first wire is connected to one electrode of the light-emitting element through the first switching element and to the fourth wire through the first switching element and the second switching element, an electrode for controlling on/off of the first switching element and the second switching element is connected to one electrode of the capacitor and to the second wire through the third switching element in the on state, the other electrode of the capacitor is connected to the first wire, an electrode for controlling on/off of the third switching element is connected to the third wire, the second switching element in turned off when the first switching element is turned on, and the second switching element in turned on when the first switching element is turned off.

Further, a terminal of the capacitor, which is connected to the first wire, may be connected to anywhere as far as it is held at a fixed potential during operations. For example, it may be connected to the other electrode of the light-emitting element, or another wire.

(The Fifth Structure)

A transistor can be used as a switching element of the first structure. Description is made on a structure in which a transistor is used as a switching element.

The invention provides a display device having a first wire and a plurality of pixels each of which includes a first transistor, a second transistor, a light-emitting element having a pair of electrodes, and a capacitor having a pair of electrodes, wherein the first wire is connected to one of a source electrode and a drain electrode of the first transistor, the other of the source electrode and the drain electrode of the first transistor is connected to one electrode of the light-emitting element and one of a source electrode and a drain electrode of the second transistor, the other of the source electrode and the drain electrode of the second transistor is connected to the other electrode of the light-emitting element, gate electrodes of the first transistor and the second transistor are connected to one electrode of the capacitor, the other electrode of the capacitor is connected to the first wire, the second transistor is turned off when the first transistor is turned on, and the second transistor is turned on when the first transistor is turned off.

Further, a terminal of the capacitor, which is connected to the first wire, may be connected to anywhere as far as it is held at a fixed potential during operations. For example, it may be connected to the other electrode of the light-emitting element, or another wire.

(The Sixth Structure)

A transistor can be used as a switching element of the second structure. Description is made on a structure in which a transistor is used as a switching element.

The invention provides a display device having a first wire, a second wire and a plurality of pixels each of which includes a first transistor, a second transistor, a light-emitting element having a pair of electrodes, and a capacitor having a pair of electrodes, wherein the first wire is connected to one of a source electrode and a drain electrode of the first transistor, the other of the source electrode and the drain electrode of the first transistor is connected to one electrode of the light-emitting element and to one of a source electrode and a drain electrode of the second transistor, the other of the source electrode and the drain electrode of the second transistor is connected to the second wire, gate electrodes of the first transistor and the second transistor are connected to one electrode of the capacitor, the other electrode of the capacitor is connected to the first wire, the second transistor is turned off when the first transistor is turned on, and the second transistor is turned on when the first transistor is turned off.

Further, a terminal of the capacitor, which is connected to the first wire, may be connected to anywhere as far as it is held at a fixed potential during operations. For example, it may be connected to the other electrode of the light-emitting element, or another wire.

(The Seventh Structure)

A transistor can be used as a switching element of the third structure. Description is made on a structure in which a transistor is used as a switching element.

The invention provides a display device having a first wire, a second wire, a third wire and a plurality of pixels each of which includes a first transistor, a second transistor, a third transistor, a capacitor having a pair of electrodes, and a light-emitting element having a pair of electrodes, wherein the first wire is connected to one of a source electrode and a drain electrode of the first transistor, the other of the source electrode and the drain electrode of the first transistor is connected to one electrode of the light-emitting element and one of a source electrode and a drain electrode of the second transistor, the other of the source electrode and the drain electrode of the second transistor is connected to the other electrode of the light-emitting element, gate electrodes of the first transistor and the second transistor are connected to one electrode of the capacitor and one of a source electrode and a drain electrode of the third transistor, the other electrode of the capacitor is connected to the first wire, the other of the source electrode and the drain electrode of the third transistor is connected to the second wire, a gate electrode of the third transistor is connected to the third wire, the second transistor is turned off when the first transistor is turned on, and the second transistor is turned on when the first transistor is turned off.

Further, a terminal of the capacitor, which is connected to the first wire, may be connected to anywhere as far as it is held at a fixed potential during operations. For example, it may be connected to the other electrode of the light-emitting element, or another wire.

(The Eighth Structure)

A transistor can be used as a switching element of the fourth structure. Description is made on a structure in which a transistor is used as a switching element.

The invention provides a display device having a first wire, a second wire, a third wire, a fourth wire and a plurality of pixels each of which includes a first transistor, a second transistor, a third transistor, a capacitor including a pair of electrodes, and a light-emitting element having a pair of electrodes, wherein the first wire is connected to one of a source electrode and a drain electrode of the first transistor, the other of the source electrode and the drain electrode of the first transistor is connected to one electrode of the light-emitting element and to one of a source electrode and a drain electrode of the second transistor, the other of the source electrode and the drain electrode of the second transistor is connected to the fourth wire, gate electrodes of the first transistor and the second transistor are connected to one electrode of the capacitor and one of a source electrode and a drain electrode of the third transistor, the other electrode of the capacitor is connected to the first wire, the other of the source electrode and the drain electrode of the third transistor is connected to the second wire, a gate electrode of the third transistor is connected to the third wire, the second transistor is turned off when the first transistor is turned on, and the second transistor is turned on when the first transistor is turned off.

Further, a terminal of the capacitor, which is connected to the first wire, may be connected to anywhere as far as it is held at a fixed potential during operations. For example, it may be connected to the other electrode of the light-emitting element, or another wire.

Note that "a transistor is turned on" means that a voltage higher than the threshold voltage is applied between a gate and a source of a transistor so that a current flows between the source and a drain. On the other hand, "a transistor is turned off" means that a voltage lower than the threshold voltage is applied between a gate and a source of a transistor so that a current does not flow between the source and a drain.

In the invention, "being connected" means "being electrically connected". Therefore, in the structure of the invention, another element (such as a switch, a transistor, a diode, and a capacitor) that enables an electric connection may be arranged between predetermined connections.

Although each of the fifth to eighth structures shows an example in which a transistor is used as a switching element, the invention is not limited to this. A switching element may be an electrical switch or a mechanical switch as far as it can control a current flow. It may be a diode, or a logic circuit configured with a diode and a transistor.

Further, a transistor used as a switching element in the invention may be a TFT using a non-single crystalline semiconductor film represented by amorphous silicon or polycrystalline silicon, a MOS transistor formed by using a semiconductor substrate or an SOI substrate, a junction transistor, a bipolar transistor, a transistor using an organic semiconductor or a carbon nanotube, or the like. Furthermore, a substrate on which a transistor is mounted is not exclusively limited to a certain type. It may be a single crystalline substrate, an SOI substrate, a quartz substrate, a glass substrate, a resin substrate, or the like.

A polarity (conductivity type) of a transistor may be either an n-channel type or a p-channel type because the transistor is operated as a mere switching element. It is to be noted that, in the case where an off current is desired to be small, a transistor having a small off current is desirably used. As such a transistor, there is a transistor provided with a region to which an impurity element imparting conductivity is added at a low concentration between a channel forming region and a source or drain region (referred to as an LDD region).

Further, in the case where a transistor operates with a source potential being close to a low potential side power source, the transistor is desirably an n-channel transistor. Conversely, in the case where a transistor operates with a source potential being close to a high potential side power source, the transistor is desirably a p-channel transistor. By employing such a structure, an absolute value of a voltage between a gate and source of a transistor can be made larger. Therefore, the transistor can easily be used as a switch. Note that a CMOS switching element may be constructed by using both an n-channel transistor and a p-channel transistor.

The invention can be applied to a display device using an element which has a proportional relation between a current flowing between a pair of electrodes and luminance as a light-emitting element. For example, it can be applied to a display device using an EL element or a light-emitting diode as a light-emitting element.

In the invention, one electrode of a light-emitting element is connected to a power source line through a first switching element, and the one electrode of the light-emitting element is also connected to the other electrode of the light-emitting element or a wire for setting potential difference between one electrode and the other electrode of the light-emitting element to be lower than a threshold voltage of the light-emitting element through a second switching element. Accordingly, in the case where a potential difference between the two electrodes of the light-emitting element becomes equal to or higher than the threshold voltage of the light-emitting element regardless of an on/off state of the first switching element so that a light-emitting element emits light, the second switching element is turned on to set a potential difference between two electrodes of the light-emitting element to be lower than the threshold voltage of the light-emitting element so that the light-emitting element emits no light and a dark spot is generated regardless of a video signal. As a result, defective fraction can be lowered so that a yield and productivity can be increased and a display device which is capable of performing high quality display can be provided.

In the invention, the operations are carried out by using video signals. Therefore, a structure of a driver circuit is not required to be complicated.

Further, in the invention, a voltage signal is used as a video signal so that a structure of a driver circuit for inputting a video signal to a pixel can be simplified.

Further, in the fifth to eighth structures of the invention, a transistor arranged in each pixel functions as a mere switching element, therefore, power consumption of a display device can be lowered.

DETAILED DESCRIPTION OF THE INVENTION

Description is made on embodiment modes and embodiments of the invention. It is to be understood that various changes and modifications will be apparent to those skilled in the art. Therefore, unless otherwise such changes and modifications depart from the scope of the invention, they should be construed as being included therein.

Embodiment Mode 1

Figure 1:
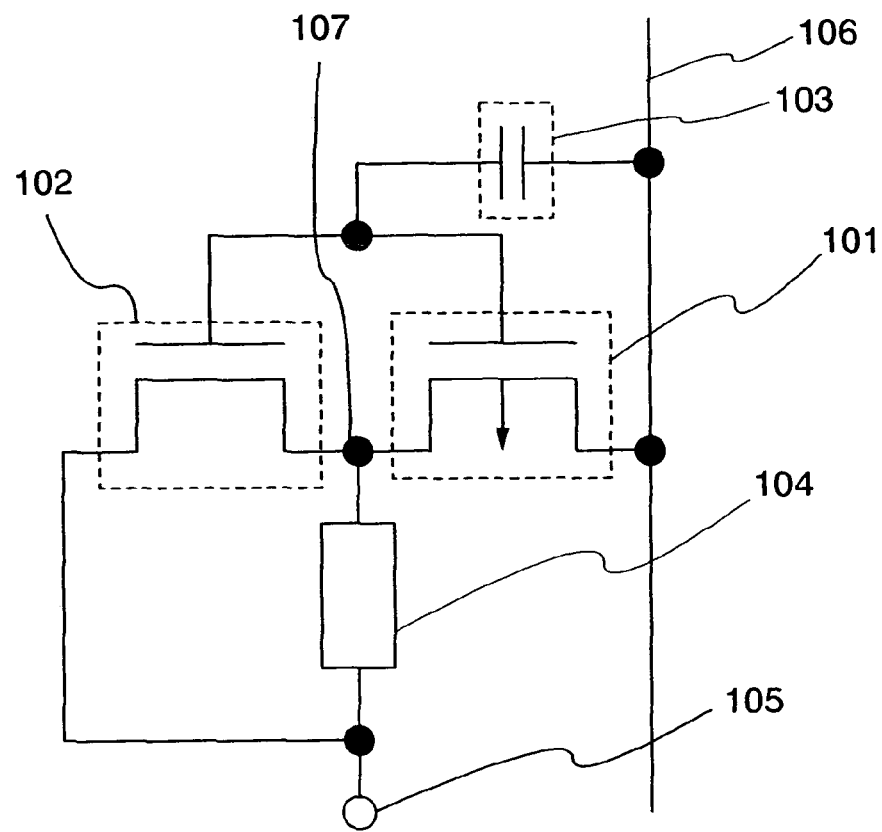
FIG. 1 is a circuit diagram showing a pixel structure of the invention.

Description is made on a pixel structure of the display device of the fifth structure with reference to FIG. 1.

In FIG. 1, reference numerals 101 and 102 are TFTs, 103 is a capacitor, 104 is a light-emitting element, 105 is a counter electrode, that is the other electrode of a pair of electrodes of the light-emitting element 104, and 106 is a power source line.

Each pixel includes the capacitor 103, the light-emitting element 104, and the TFTs 101 and 102.

The power source line 106 is connected to one of a source electrode and a drain electrode of the TFT 101, the other of the source electrode and the drain electrode of the TFT 101 is connected to one electrode of the light-emitting element 104 and one of a source electrode and a drain electrode of the TFT 102, the other of the source electrode and the drain electrode of the TFT 102 is connected to the other electrode of the light-emitting element 104, gate electrodes of the TFTs 101 and 102 are connected to one electrode of the capacitor 103, and the other electrode of the capacitor 103 is connected to the power source line 106.

A connecting node of the TFTs 101 and 102 and one electrode of the light-emitting element 104 is a node Vm 107.

A potential difference between the power source line 106 and the other electrode of the light-emitting element 104 is higher than the threshold voltage of the light-emitting element 104.

Figure 5:
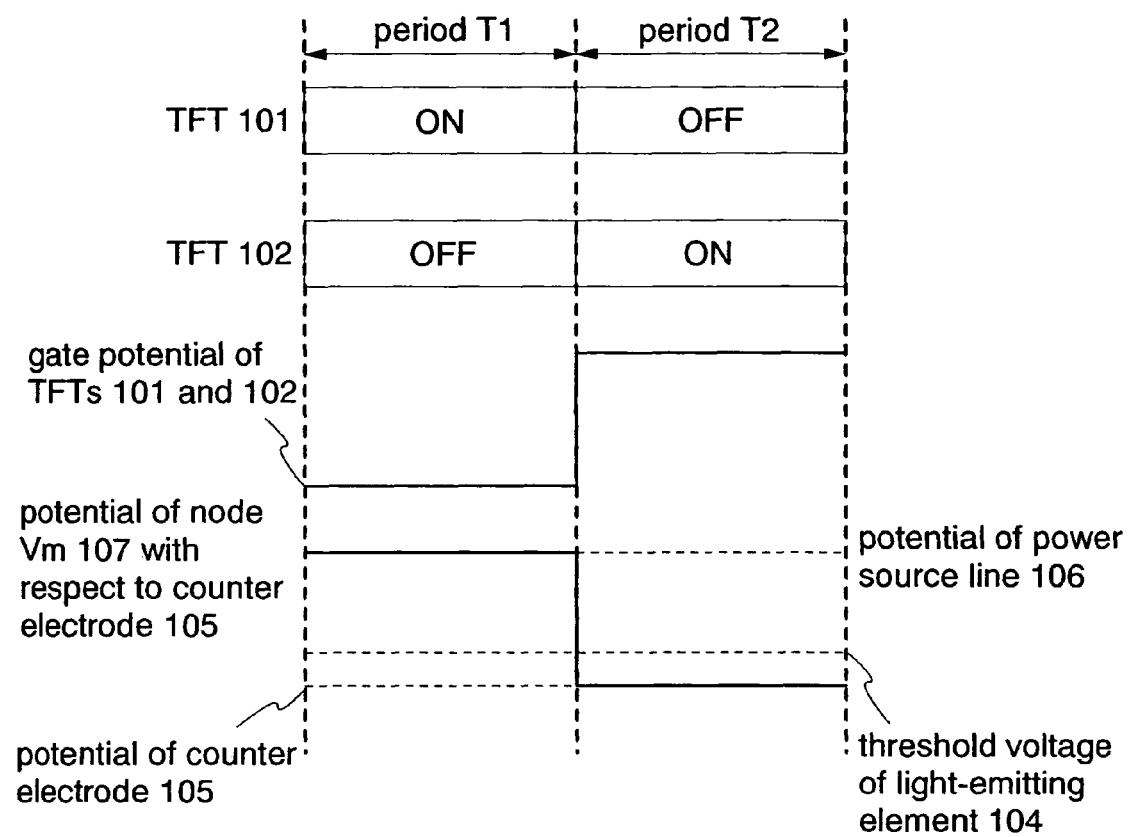
FIG. 5 is a timing chart of a pixel of the invention.

Description is made on a driving method of the pixel in FIG. 1 with reference to a timing chart in FIG. 5.

First, description is made on a defective operation in the case where the invention is available.

Such an operation is carried out in the case where a potential of the power source line 106 is applied to the node Vm 107 regardless of an on/off state of the TFT 101, or in the case where such a potential is applied to the node Vm 107 that allows a potential difference between the node Vm 107 and the other electrode of the light-emitting element to be equal to or higher than the threshold voltage of the light-emitting element, that is, the source and the drain of the TFT 101 are short-circuited.

FIG. 5 shows a condition of an operation in the case where the source and the drain of the TFT 101 are short-circuited. Note that in FIG. 5, a potential of the power source line 106 is higher than that of the counter electrode 105.

In a period T1, a signal for turning the TFT 101 on and the TFT 102 off is applied to the gates of the TFTs 101 and 102. At this time, a potential of the power source line 106 is supplied to the node Vm 107. Accordingly, a potential difference between the node Vm 107 and the other electrode of the light-emitting element 104 becomes equal to or higher than the threshold voltage of the light-emitting element 104 so that the light-emitting element 104 emits light.

In a period T2, a signal for turning the TFT 101 off and the TFT 102 on is applied to the gates of the TFTs 101 and 102. At this time, the node Vm 107 and the other electrode of the light-emitting element 104 are electrically connected. Accordingly, a potential difference between the node Vm 107 and the other electrode of the light-emitting element 104 becomes lower than the threshold voltage of the light-emitting element 104 so that the light-emitting element 104 emits no light.

In the case where a short circuit is caused between the source and the drain of the TFT 101 and a potential of the power source line 106 is supplied to the node Vm 107, a gate voltage to turn the TFT 101 off and the TFT 102 on is applied so that a luminescent spot can be turned to be a dark spot.

Although a p-channel TFT is used as the TFT 101, and an n-channel TFT is used as the TFT 102 in FIG. 1, each of the TFT 101 and the TFT 102 may have opposite polarity. Therefore, the polarity of each TFT is not limited to this.

Note that although in FIG. 1, the other electrode of the capacitor 103 is connected to the power source line 106, the other electrode of the capacitor 103 may be connected to anywhere as far as it is held at a certain potential when the TFTs 101 and 102 are operated.

Note that there are a digital gray scale method and an analog gray scale method as a driving method for expressing a gray scale of a display device, and both can be applied. In the digital gray scale method, a light-emitting element is controlled in a digital manner to be turned on and off, thereby a gray scale is expressed. On the other hand, in the analog gray scale method, there is a method for controlling the luminance of the light-emitting element in an analog manner. It is more effective to apply the analog gray scale method as the driving method of a display device of the invention. The reason is as follows.

In the case where the luminance of the light-emitting element is controlled in the analog manner by the analog gray scale method, a potential that has an analog value is applied to the gate of the TFT 101, the TFT is operated in a saturation region, and the luminance of the light-emitting element is controlled. When the TFT 101 is short-circuited, the luminance of the light-emitting element can not be controlled even if the gate potential of the TFT 101 is controlled. That is, since the luminance of the light-emitting element becomes higher than the desired luminance, the pixel is turned to be a luminescent spot. However, by applying the structure of the invention, the pixel can be turned to be a dark spot consistently by a signal that turns the TFT 102 on is inputted even when the TFT 101 is short-circuited.

Embodiment Mode 2

Figure 2:
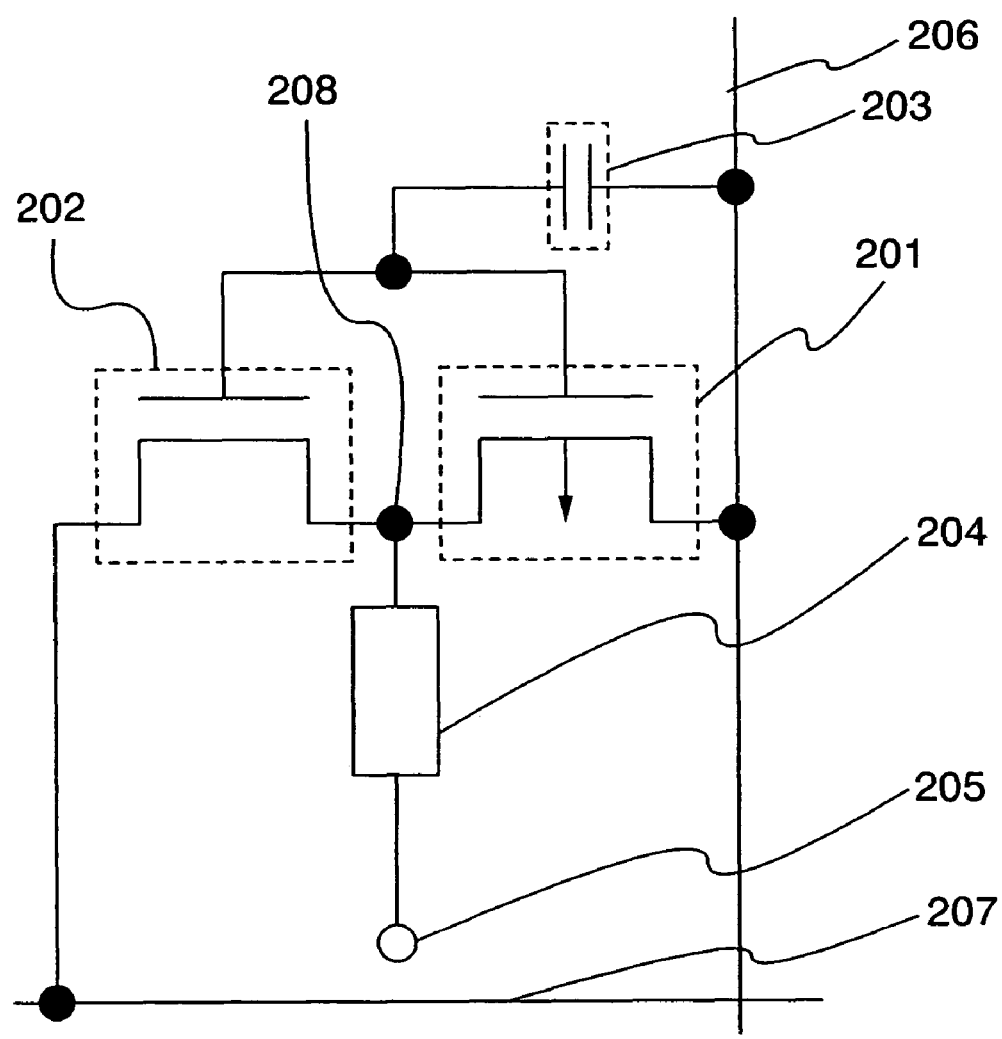
FIG. 2 is a circuit diagram showing a pixel structure of the invention.

Description is made on a pixel structure of the display device of the sixth structure with reference to FIG. 2.

In FIG. 2, reference numerals 201 and 202 are TFTs, 203 is a capacitor, 204 is a light-emitting element, 205 is a counter electrode, that is the other electrode of a pair of electrodes of the light-emitting element 204, and 206 and 207 are power source lines.

Each pixel includes the capacitor 203, the light-emitting element 204, and the TFTs 201 and 202.

The power source line 206 is connected to one of a source electrode and a drain electrode of the TFT 201, the other of the source electrode and the drain electrode of the TFT 201 is connected to one electrode of the light-emitting element 204 and one of a source electrode and a drain electrode of the TFT 202, the other of the source electrode and the drain electrode of the TFT 202 is connected to the power source line 207, gate electrodes of the TFTs 201 and 202 are connected to one electrode of the capacitor 203, and the other electrode of the capacitor 203 is connected to the power source line 206.

A connecting node of the TFTs 201 and 202 and one electrode of the light-emitting element 204 is a node Vm 208.

A potential difference between the power source line 206 and the other electrode of the light-emitting element 204 is a higher potential than a threshold voltage of the light-emitting element 204, and a potential difference between the power source line 207 and the other electrode of the light-emitting element 204 is a lower potential than the threshold voltage of the light-emitting element 204.

Figure 6:
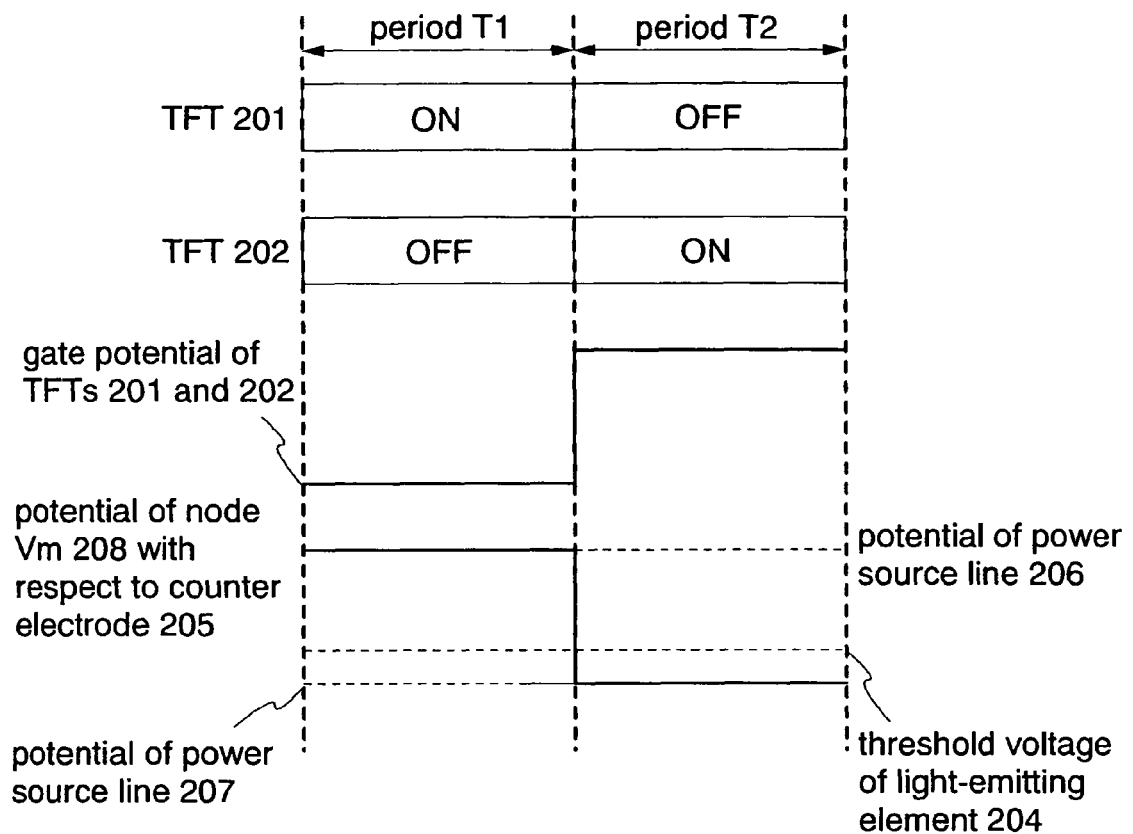
FIG. 6 is a timing chart of a pixel of the invention.

Description is made on a driving method of the pixel in FIG. 2 with reference to a timing chart in FIG. 6.

First, description is made on a defective operation in the case where the invention is available.

Such an operation is carried out in the case where a potential of the power source line 206 is applied to the node Vm 208 regardless of an on/off state of the TFT 201, or in the case where such a potential is applied to the node Vm 208 that allows a potential difference between the node Vm 208 and the other electrode of the light-emitting element to be equal to or higher than the threshold voltage of the light-emitting element, that is, the source and the drain of the TFT 201 are short-circuited.

FIG. 6 shows a condition of an operation in the case where the source and the drain of the TFT 201 are short-circuited. Note that in FIG. 6, a potential of the power source line 206 is higher than that of the power source line 207.

In a period T1, a signal for turning the TFT 201 on and the TFT 202 off is applied to the gates of the TFTs 201 and 202. At this time, a potential of the power source line 206 is supplied to the node Vm 208. Accordingly, a potential difference between the node Vm 208 and the other electrode of the light-emitting element 204 becomes equal to or higher than the threshold voltage of the light-emitting element 204 so that the light-emitting element 204 emits light.

In a period T2, a signal for turning the TFT 201 off and the TFT 202 on is applied to the gates of the TFTs 201 and 202. At this time, the node Vm 208 is electrically connected to the power source line 207. Accordingly, a potential difference between the node Vm 208 and the other electrode of the light-emitting element 204 becomes lower than the threshold voltage of the light-emitting element 204 so that the light-emitting element 204 emits no light.

In the case where a short circuit is caused between the source and the drain of the TFT 201 and the potential of the power source line 206 is supplied to the node Vm 208, a gate voltage to turn the TFT 201 off and the TFT 202 on is applied so that a luminescent spot can be turned to be a dark spot.

Although a p-channel TFT is used as the TFT 201, and an n-channel TFT is used as the TFT 202 in FIG. 2, each of the TFT 201 and the TFT 202 may have an opposite polarity. Therefore, the polarity of each TFT is not limited to this.

Note that although in FIG. 2, the other electrode of the capacitor 203 is connected to the power source line 206, the other electrode of the capacitor 203 may be connected to anywhere as far as it is held at a certain potential when the TFTs 201 and 202 are operated.

Embodiment Mode 3

Figure 3:
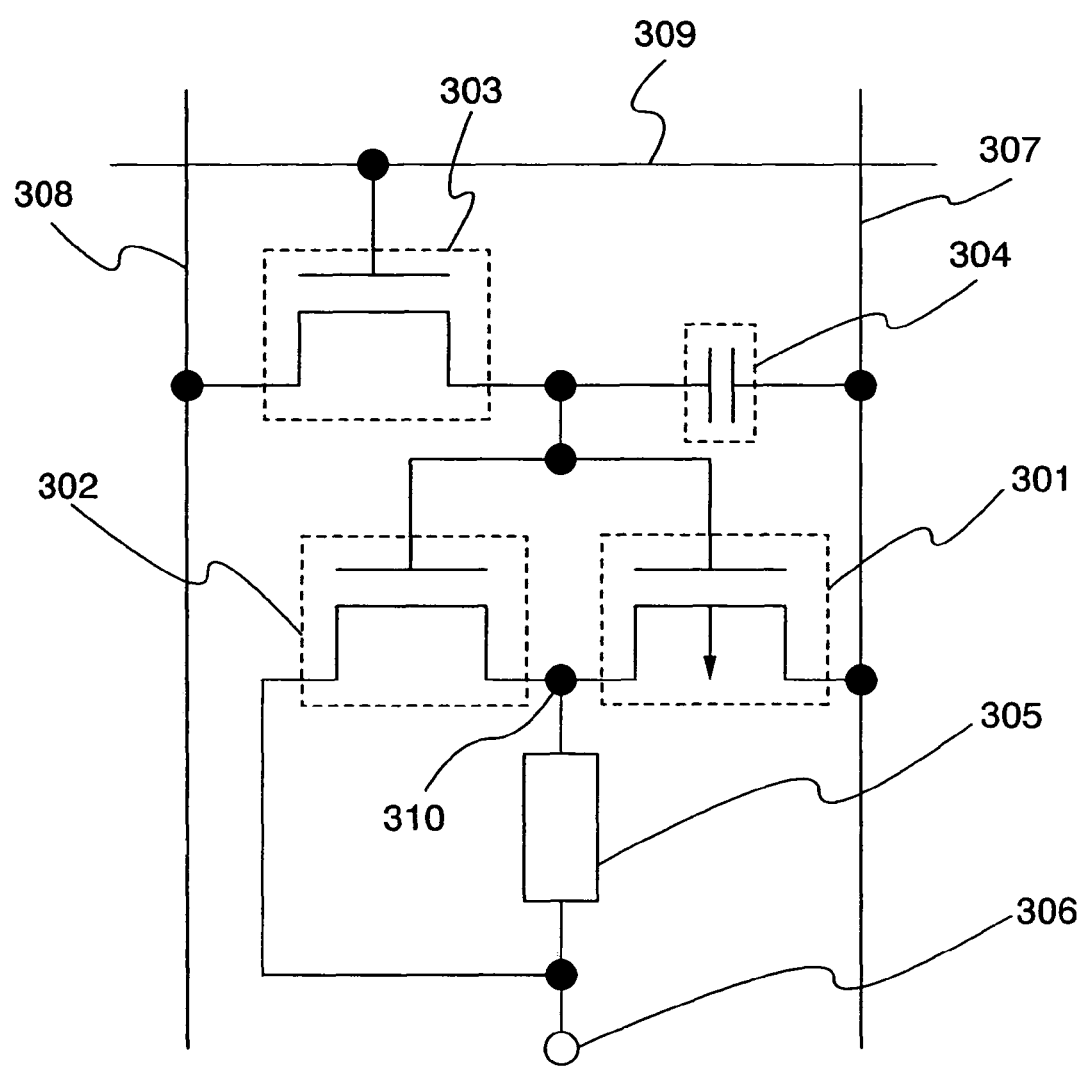
FIG. 3 is a circuit diagram showing a pixel structure of the invention.

Description is made on a pixel structure of the display device of the seventh structure with reference to FIG. 3.

In FIG. 3, reference numerals 301, 302, and 303 are TFTs, 304 is a capacitor, 305 is a light-emitting element, 306 is a counter electrode, that is the other electrode of a pair of electrodes of the light-emitting element 305, 307 is a power source line, 308 is a source signal line, and 309 is a gate select line.

Each pixel includes the capacitor 304, the light-emitting element 305, and the TFTs 301, 302, and 303.

The power source line 307 is connected to one of a source electrode and a drain electrode of the TFT 301, the other of the source electrode and the drain electrode of the TFT 301 is connected to one electrode of the light-emitting element 305 and one of a source electrode and a drain electrode of the TFT 302, the other of the source electrode and the drain electrode of the TFT 302 is connected to the other electrode of the light-emitting element 305, gate electrodes of the TFTs 301 and 302 are connected to one electrode of the capacitor 304 and one of a source electrode and a drain electrode of the TFT 303, the other electrode of the capacitor 304 is connected to the power source line 307, the other of the source electrode and the drain electrode of the TFT 303 is connected to the source signal line 308, and a gate electrode of the TFT 303 is connected to the gate select line 309.

A connecting node of the TFTs 301 and 302 and one electrode of the light-emitting element 305 is a node Vm 310.

A potential difference between the power source line 307 and the other electrode of the light-emitting element 305 is a higher potential than the threshold voltage of the light-emitting element 305.

Figure 7:
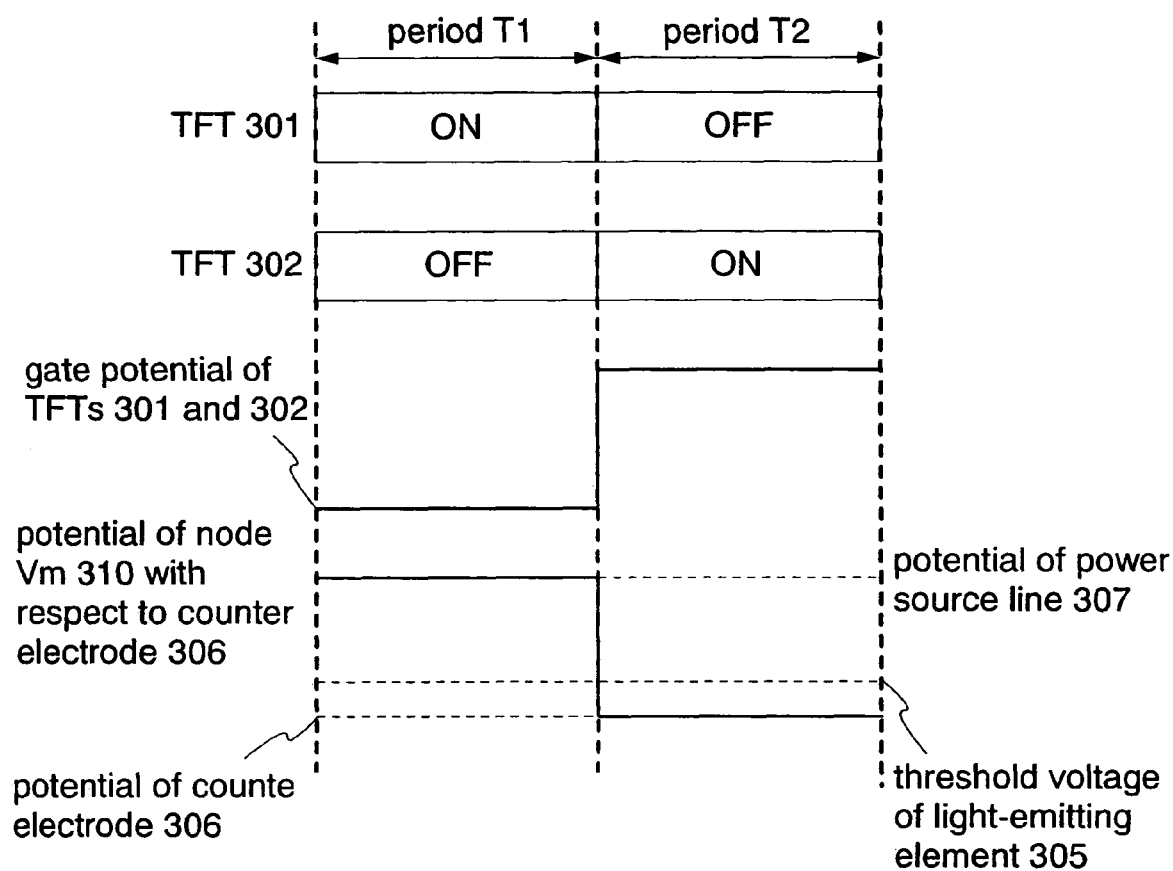
FIG. 7 is a timing chart of a pixel of the invention.

Description is made on a driving method of the pixel in FIG. 3 with reference to a timing chart in FIG. 7.

First, description is made on a defective operation in the case where the invention is available.

Such an operation is carried out in the case where a potential of the power source line 307 is applied to the node Vm 310 regardless of an on/off state of the TFT 301, or in the case where such a potential is applied to the node Vm 310 that allows a potential difference between the node Vm 310 and the other electrode of the light-emitting element to be equal to or higher than the threshold voltage of the light-emitting element, that is, the source and the drain of the TFT 301 are short-circuited.

FIG. 7 shows a condition of an operation in the case where the source and the drain of the TFT 301 are short-circuited.

Note that in FIG. 7, a potential of the power source line 307 is higher than that of the counter electrode 306.

In a period T1, a signal for turning the TFT 301 on and the TFT 302 off is applied to gates of the TFTs 301 and 302 from the source signal line 308 through the TFT 303 which is in on state. At this time, a potential of the power source line 307 is supplied to the node Vm 310. Accordingly, a potential difference between the node Vm 310 and the other electrode of the light-emitting element 305 becomes equal to or higher than a threshold voltage of the light-emitting element 305 so that the light-emitting element 305 emits light.

In a period T2, a signal for turning the TFT 301 off and the TFT 302 on is applied to the gates of the TFTs 301 and 302 from the source signal line 308 through the TFT 303 which is in an on state. At this time, the node Vm 310 is electrically connected to the other electrode of the light-emitting element 305. Accordingly, a potential difference between the node Vm 310 and the other electrode of the light-emitting element 305 is lower than the threshold voltage of the light-emitting element 305 so that the light-emitting element 305 emits no light.

In the case where a short circuit is caused between the source and the drain of the TFT 301 and a potential of the power source line 307 is supplied to the node Vm 310, a gate voltage to turn the TFT 301 off and the TFT 302 on is applied so that a luminescent spot can be turned to be a dark spot.

Although a p-channel TFT is used as the TFT 301, an n-channel TFT is used as the TFT 302, and an n-channel TFT is used as the TFT 303 in FIG. 3, each of the TFTs 301 and 302 may have an opposite polarity. Therefore, the polarity of each TFT is not limited to this.

Note that although in FIG. 3, the other electrode of the capacitor 304 is connected to the power source line 307, it may be connected to anywhere as far as it is held at a certain potential when the TFTs 301 and 302 are operated.

Embodiment Mode 4

Figure 4:
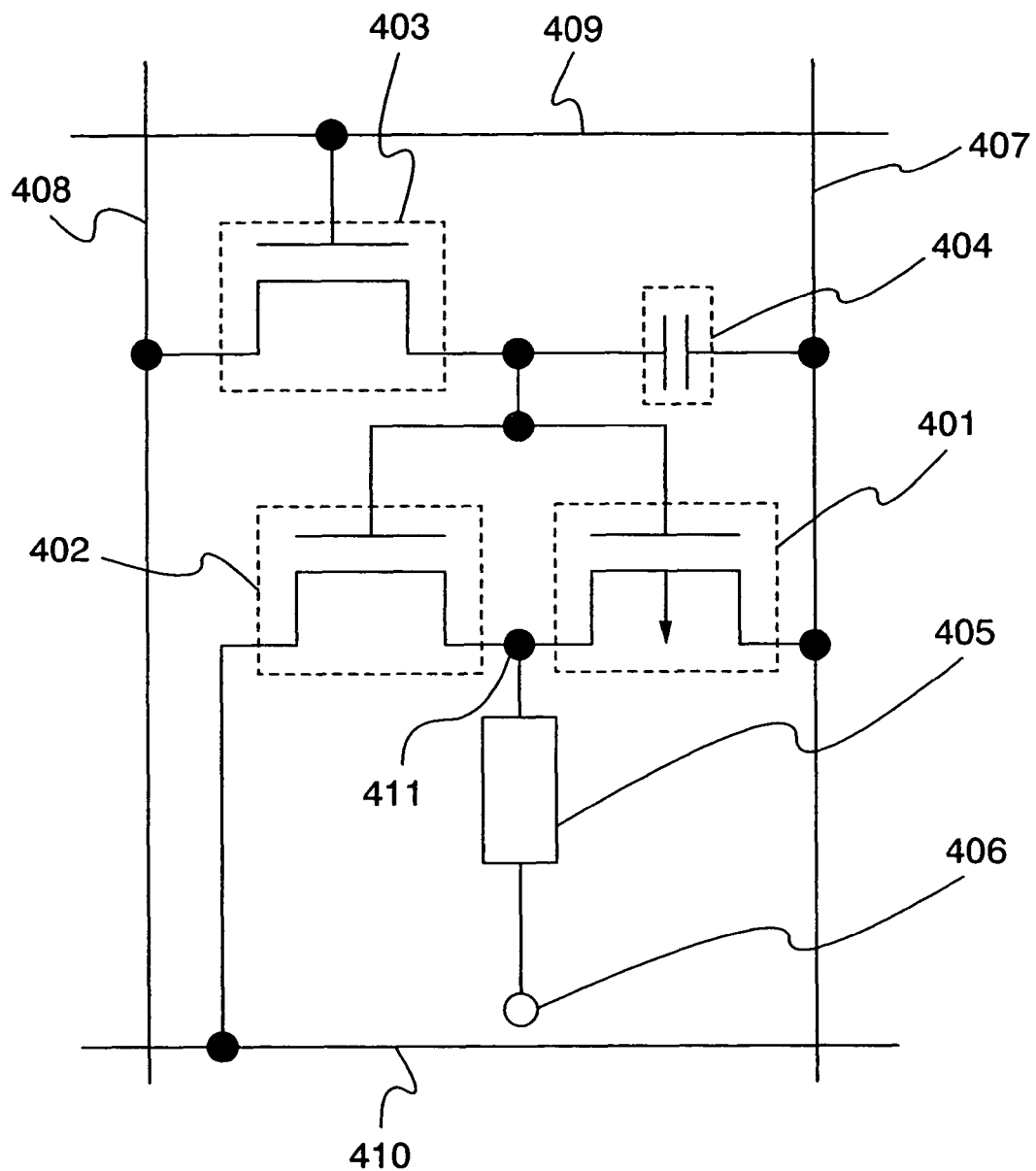
FIG. 4 is a circuit diagram showing a pixel structure of the invention.

Description is made on a pixel structure of the display device of the eighth structure with reference to FIG. 4.

In FIG. 4, reference numerals 401, 402, and 403 are TFTs, 404 is a capacitor, 405 is a light-emitting element, 406 is a counter electrode, that is the other electrode of a pair of electrodes of the light-emitting element 405, and 407 and 410 are power source lines, 408 is a source signal line, and 409 is a gate select line.

Each pixel includes the capacitor 404, the light-emitting element 405, and the TFTs 401, 402, and 403.

The power source line 407 is connected to one of a source electrode and a drain electrode of the TFT 401, the other of the source electrode and the drain electrode of the TFT 401 is connected to one electrode of the light-emitting element 405 and one of a source electrode and a drain electrode of the TFT 402, the other of the source electrode and the drain electrode of the TFT 402 is connected to the power source line 410, gate electrodes of the TFTs 401 and 402 are connected to one electrode of the capacitor 404 and one of a source electrode and a drain electrode of the TFT 403, the other electrode of the capacitor 404 is connected to the power source line 407, the other of the source electrode and the drain electrode of the TFT 403 is connected to the source signal line 408, and a gate electrode of the TFT 403 is connected to the gate select line 409.

A connecting node of the TFTs 401 and 402 and one electrode of the light-emitting element 405 is a node Vm 411.

A potential difference between the power source line 407 and the other electrode of the light-emitting element 405 is a higher potential than a threshold voltage of the light-emitting element 405, and a potential difference between the power source line 410 and the other electrode of the light-emitting element 405 is a lower potential than the threshold voltage of the light-emitting element 405.

Figure 8:
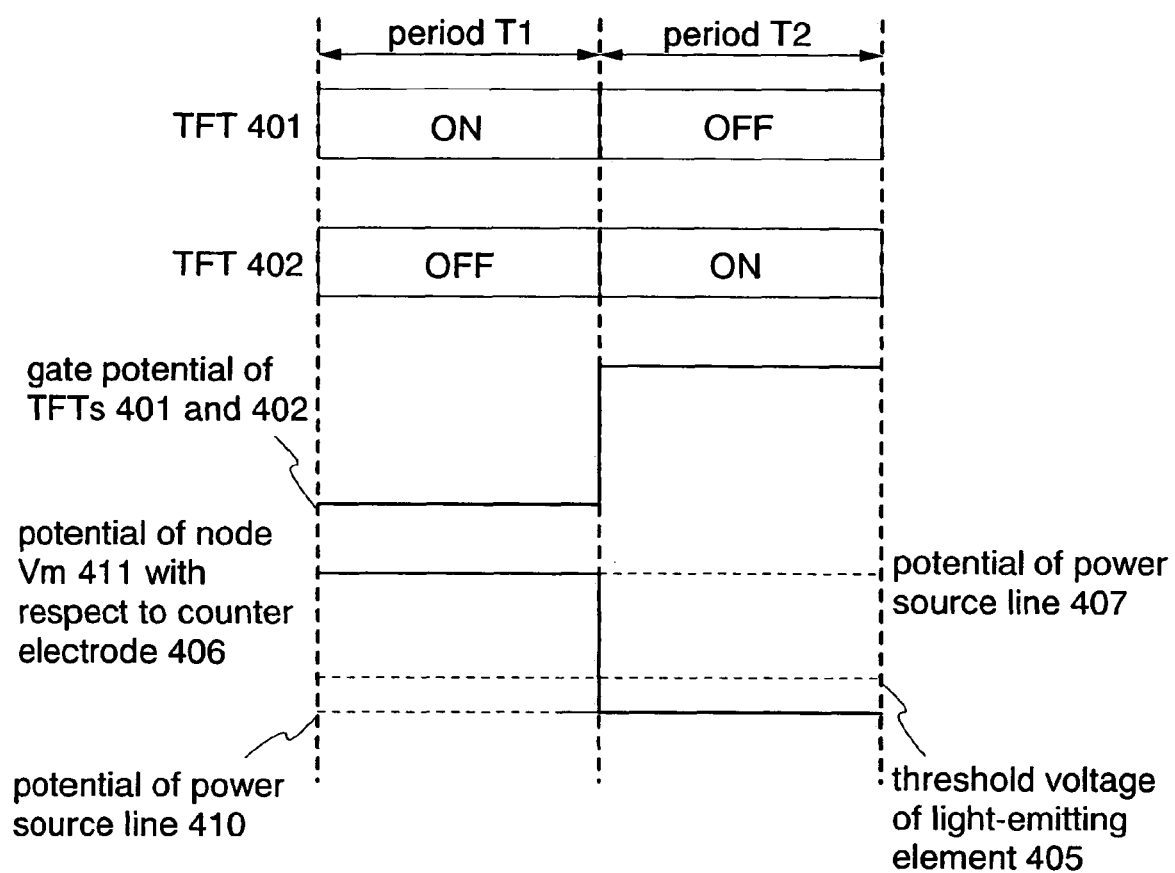
FIG. 8 is a timing chart of a pixel of the invention.

Description is made on a driving method of the pixel in FIG. 4 with reference to a timing chart in FIG. 8.

First, description is made on a defective operation in the case where the invention is available.

Such an operation is carried out in the case where a potential of the power source line 407 is applied to the node Vm 411 regardless of an on/off state of the TFT 401, or in the case where such a potential is applied to the node Vm 411 that allows a potential difference between the node Vm 411 and the other electrode of the light-emitting element 405 to be equal to or higher than the threshold voltage of the light-emitting element, that is, the source and the drain of the TFT 401 are short-circuited.

FIG. 8 shows a condition of an operation in the case where the source and the drain of the TFT 401 are short-circuited. Note that in FIG. 8, a potential of the power source line 407 is higher than that of the power source line 410.

In a period T1, a signal for turning the TFT 401 on and the TFT 402 off is applied to the gates of the TFTs 401 and 402 from the source signal line 408 through the TFT 403 which is in an on state. At this time, a potential of the power source line 407 is supplied to the node Vm 411. Accordingly, a potential difference between the node Vm 411 and the other electrode of the light-emitting element 405 becomes equal to or higher than the threshold voltage of the light-emitting element 405 so that the light-emitting element 405 emits light.

In a period T2, a signal for turning the TFT 401 off and the TFT 402 on is applied to the gates of the TFTs 401 and 402 from the source signal line 408 through the TFT 403 which is in an on state. At this time, the node Vm 411 is electrically connected to the power source line 410. Accordingly, a potential difference between the node Vm 411 and the other electrode of the light-emitting element 405 is lower than the threshold voltage of the light-emitting element 405 so that the light-emitting element 405 emits no light.

In the case where a short circuit is caused between the source and the drain of the TFT 401 and a potential of the power source line 407 is supplied to the node Vm 411, a gate voltage to turn the TFT 401 off and the TFT 402 on is applied so that a luminescent spot can be turned to be a dark spot.

Although a p-channel is used as the TFT 401, an n-channel TFT is used as the TFT 402, and an n-channel TFT is used as the TFT 403 in FIG. 4, each of the TFTs 401 and 402 may have an opposite polarity (that is, when the TFT 401 is a p-channel TFT, the TFT 402 is an n-channel TFT, and when the TFT 401 is an n-channel TFT, the TFT 402 is a p-channel TFT). Therefore, the polarity of each TFT is not limited to this.

Note that although in FIG. 4, the other electrode of the capacitor 404 is connected to the power source line 407, the other electrode of the capacitor 404 may be connected to anywhere as far as it is held at a certain potential when the TFTs 401 and 402 are operated.

In Embodiment Modes 1 to 4, description is made on the arrangements of TFTs with reference to FIGS. 1 to 4. However, in the invention, the arrangement of TFTs is not limited to those in FIGS. 1 to 4. If a pixel can be operated in accordance with the timing charts shown in FIGS. 5 to 8, TFTs can be arranged in arbitrary place. For example, an erasing TFT may be arranged so as to carry out an erasing operation by adding a TFT in the same way as a digital time gray scale method.

Further, as a method of detecting a pixel in which a luminescent spot is generated, it may be detected in each pixel or each group of several pixels by using a current value in the case where a light-emitting element emits light, or may be detected by eyes or a device for detecting a luminescent spot. The method of detecting a luminescent spot is not limited to these.

In the invention, a known driver circuit can be used as that for inputting a signal to a pixel.

Embodiment 1

Figure 9:
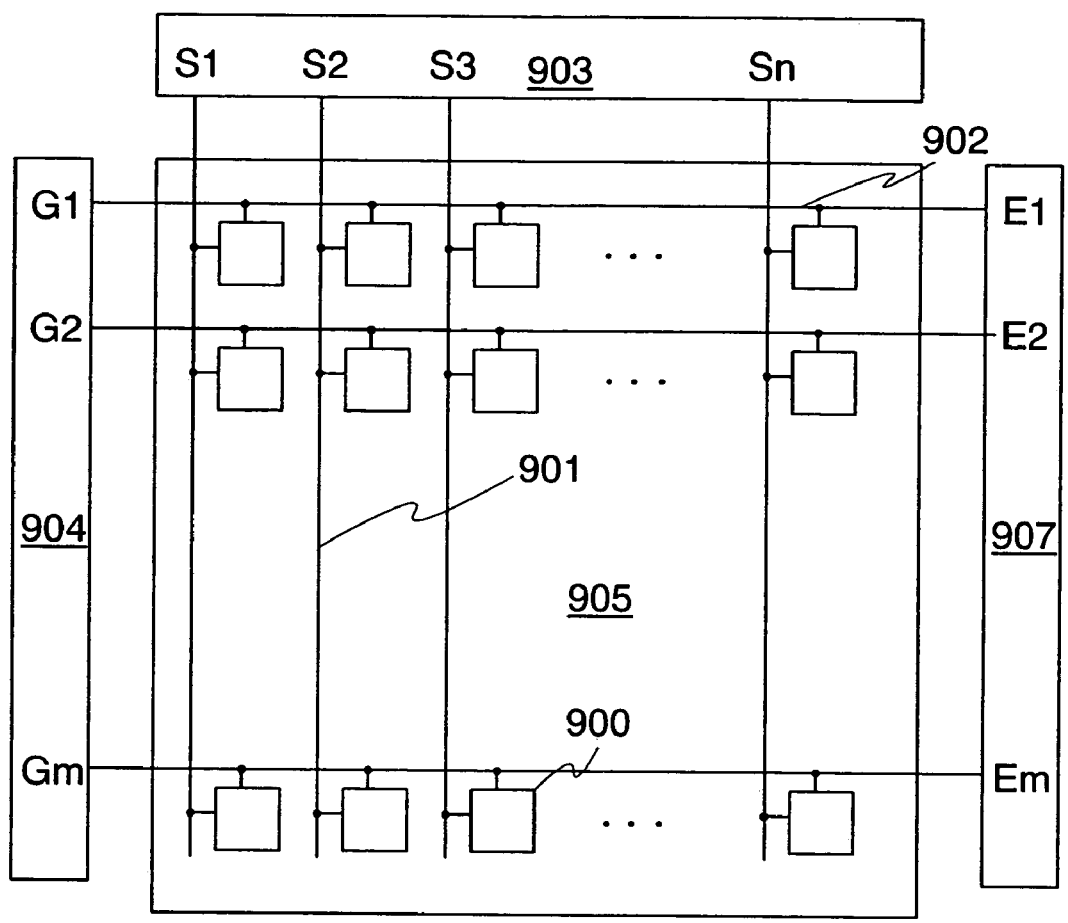
FIG. 9 is a view showing Embodiment 1.

In this embodiment, description is made on a display device including a pixel which has a structure shown in FIGS. 3 and 4 in embodiment modes of the invention. FIG. 9 shows an example of a structure of the display device. It includes a display portion 905 in which m rows and n columns (m and n are natural numbers) of pixels 900 are arranged in matrix, and a source signal line driver circuit 903, a writing gate select line driver circuit 904, an erasing gate select line driver circuit 907 on the periphery of the display portion 905. Each of source signal lines 901 indicated by S1 to Sn are arranged with respect to each of the columns of the pixels 900, and each of gate select lines 902 indicated by G1 to Gm are arranged with respect to each of the rows of the pixels 900.

The source signal line 308 in FIG. 3 corresponds to the source signal line 901 in FIG. 9. The gate signal line 309 in FIG. 3 corresponds to the gate select line 902 in FIG. 9. The source signal line 408 in FIG. 4 corresponds to the source signal line 901 in FIG. 9. The gate select line 409 in FIG. 4 corresponds to the gate select line 902 in FIG. 9. Note that the other wires shown in FIGS. 3 and 4 are not shown in FIG. 9.

The display device shown in FIG. 9 uses a driving method by which one of the gate select lines 902 can write and erase by dividing a gate selection period into a writing period and an erasing period.

Note that known structures may be used for the source signal line driver circuit 903, the writing gate select line driver circuit 904, and the erasing gate select line driver circuit 907.

Embodiment 2

Description is made on an example of a display device of the invention, which is actually manufactured.

Figure 10A:
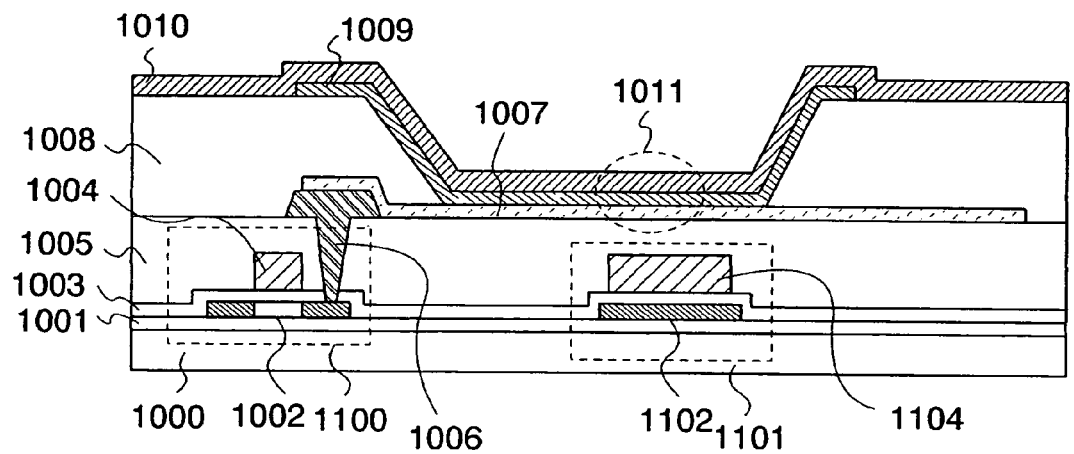
FIGS. 10A and 10B are views showing Embodiment 2.
Figure 10B:
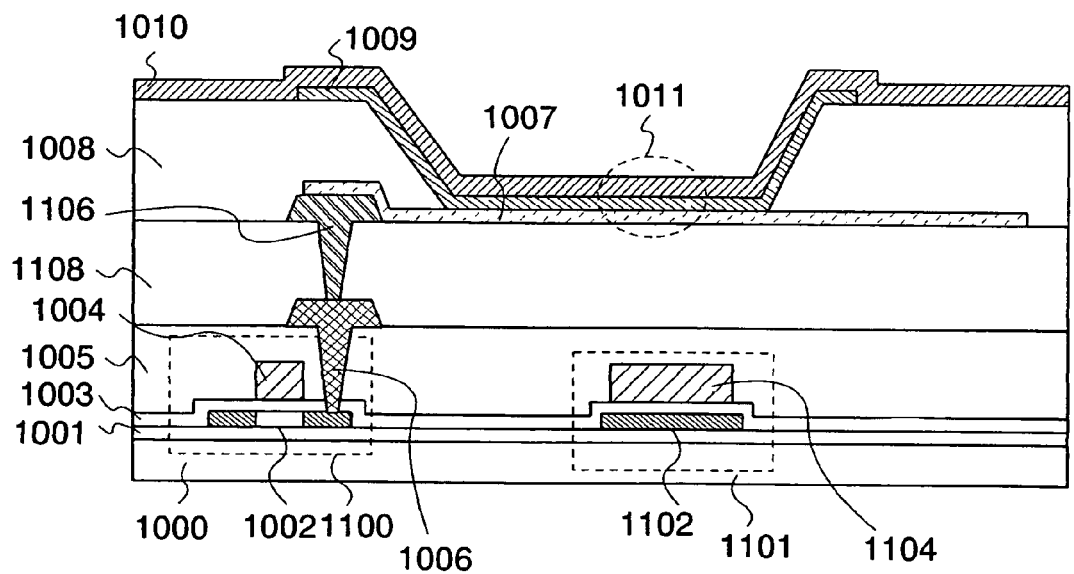

FIGS. 10A and 10B are cross-sectional views of a pixel in a display device described in Embodiment Modes 1 to 4 of the invention. An example is shown in which a TFT is used as a transistor to be arranged in a pixel of Embodiment Modes 1 to 4.

In FIGS. 10A and 10B, reference numeral 1000 is a substrate, 1001 is a base film, 1002 and 1102 are semiconductor layers, 1003 is a first insulating film, 1004 is a gate electrode, 1104 is an electrode, 1005 is a second insulating film, 1006 is an electrode, 1007 is a first electrode, 1008 is a third insulating film, 1009 is a light-emitting layer, 1010 is a second electrode, 1100 is a TFT, 1011 is a light-emitting element, and 1101 is a capacitor.

In FIGS. 10A and 10B, the TFT 1100, the capacitor 1101, and the light-emitting element 1011 are shown as representative elements which constitute a pixel.

Description is made on a structure of FIG. 10A.

As the substrate 1000, for example, a glass substrate such as a barium borosilicate glass and an alumino-borosilicate glass, a quartz substrate, a ceramics substrate, or the like may be used. A metallic substrate including stainless steel or a semiconductor substrate over which an insulating film is formed may also be used. Further, a substrate formed of a flexible synthetic resin such as plastic may be used. A surface of the substrate 1000 may be flattened by polishing such as CMP (chemical mechanical polishing).

As the base film 1001, an insulating film such as silicon oxide, silicon nitride, or silicon nitride oxide may be used. By the base film 1001, it can be prevented that an alkali metal such as Na and an alkali earth metal included in the substrate 1000 diffuses into the semiconductor layer 1002 and a property of the TFT 1100 is adversely affected. Although in FIGS. 10A and 10B, a single layer structure is employed for the base film 1001, it may be formed of two or more layers. Note that in the case where diffusion of impurities is not a big problem in the case of using a quartz substrate, for example, the base film 1001 is not always required to be provided.

As the semiconductor layer 1002 and the semiconductor layer 1102, a crystalline semiconductor film and an amorphous semiconductor film which are selectively etched may be used. A crystalline semiconductor film can be obtained by crystallizing an amorphous semiconductor film. As a method of crystallization, laser crystallization, thermal crystallization using RTA (Rapid Thermal Annealing) or an annealing furnace, thermal crystallization using a metal element for promoting crystallization or the like may be used. The semiconductor layer 1002 includes a channel forming region and a pair of impurity regions to which an impurity element imparting conductivity is added. Note that another impurity region to which an impurity element is added at a low concentration may be provided between the channel forming region and the pair of impurity regions. Accordingly, the whole semiconductor layer 1102 can have a structure to which an impurity element imparting conductivity is added.

The first insulating film 1003 can be formed of a single layer or stacked layers of a plurality of films by using silicon oxide, silicon nitride, silicon nitride oxide, or the like.

The gate electrode 1004 and the electrode 1104 are formed of a single layer or stacked layers of elements selected from Ta, W, Ti, Mo, Al, Cu, Cr, and Nd or an alloy or a compound containing such elements.

The TFT 1100 includes the semiconductor layer 1002, the gate electrode, 1004, and the first insulating film 1003 between them. Although in FIGS. 10A and 10B, only the TFT 1100 connected to the first electrode 1007 of the light-emitting element 1011 is shown as a TFT constituting a pixel, a pixel may include a plurality of TFTs. Further, although in this embodiment, the TFT 1100 is shown as a top gate transistor, it may also be a bottom gate transistor having a gate electrode below the semiconductor layer, or a dual gate transistor having gate electrodes above and below the semiconductor layer.

The capacitor 1101 includes the first insulating film 1003 as a dielectric, and the semiconductor layer 1102 and the electrode 1104 as a pair of electrodes that faces each other with the first insulating film 1003 interposed therebetween. FIGS. 10A and 10B show an example in which one of the pair of electrodes of the capacitor included in a pixel is the semiconductor layer 1102 formed at the same time as the semiconductor layer 1002 of the TFT 1100, and the other electrode is the electrode 1104 formed at the same time as the gate electrode 1004 of the TFT 1100. However, the invention is not limited to this.

The second insulating film 1005 can be formed of a single layer or stacked layers of an inorganic insulating film or an organic insulating film. As an inorganic insulating film, a silicon oxide film formed by CVD, a silicon oxide film applied by SOG (Spin On Glass), or the like can be used. As an organic insulating film, a film such as polyimide, polyamide, BCB (benzocyclobutene), acrylic, a positive photosensitive organic resin, or a negative photosensitive organic resin can be used.

Further, as the second insulating film 1005, a material containing siloxane may be used. Note that siloxane is a material having a skeleton of a bond of silicon (Si) and oxygen (O). As a substituent, an organic group containing at least hydrogen (for example, alkyl group, or aromatic hydrocarbon) is used. Alternatively, a fluoro group, or both an organic group containing at least hydrogen and a fluoro group may be used as a substituent.

The electrode 1006 is formed of a single layer or stacked layers of an element selected from Al, Ni, C, W, Mo, Ti, Pt, Cu, Ta, Au, and Mn, or an alloy containing such elements.

One or both of the first electrode 1007 and the second electrode 1010 can be light-transmissive electrodes. As a light-transmissive electrode, indium tin oxide (ITO), zinc oxide (ZnO), indium zinc oxide (IZO), and zinc oxide to which gallium is added (GZO), or another light-transmissive conductive oxide material may be used. Indium tin oxide containing silicon oxide, indium tin oxide containing titanium oxide, indium tin oxide containing molybdenum oxide, ITO to which titanium, molybdenum, or gallium is added, indium oxide containing silicon oxide in which 2 to 20 wt % of zinc oxide (ZnO) is mixed may also be used as a light-transmissive electrode.

The other of the first electrode 1007 and the second electrode 1010 may be formed of a non-light transmissive material. For example, an alkali metal such as Li and Cs, an alkali earth metal such as Mg, Ca, and Sr, an alloy containing such metals (Mg:Ag, Al:Li, Mg:In, or the like), a compound of such metals ($CaF_2$ or CaN), or a rare earth metal such as Yb and Er can be used.

The third insulating film 1008 can be formed using the same material as the second insulating film 1005. The third insulating film 1008 is formed on the periphery of the first electrode 1007 so as to cover an end portion of the first electrode 1007, and has a function of separating the light-emitting layer 1009 in an adjacent pixel.

The light-emitting layer 1009 is formed of a single layer or stacked layers. In the case where it is formed of stacked layers, these layers can be categorized into a hole injecting layer, a hole transporting layer, a light-emitting layer, an electron transporting layer, an electron injecting layer, and the like in terms of a carrier transporting property. Note that a boundary between layers is not always required to be clear, there is a case where materials constituting adjacent layers are mixed with each other so that an interface is unclear. An organic material or an inorganic material can be used for each layer. As an organic material, any of a high molecular weight organic material, a medium molecular weight organic material, and a low molecular weight organic material can be used.

The light-emitting element 1011 is formed of the light-emitting layer 1009, and the first electrode 1007 and the second electrode 1010 which interpose the light-emitting layer 1009 therebetween. One of the first electrode 1007 and the second electrode 1010 corresponds to an anode, and the other corresponds to a cathode. When a forward bias voltage higher than a threshold voltage is applied between the anode and the cathode, a current flows from the anode to the cathode so that the light-emitting element 1011 emits light.

Description is made on a structure of FIG. 10B. Note that the same reference numeral is used for a common portion between FIGS. 10A and 10B, and the description is omitted.

FIG. 10B shows a structure in which an insulating film 1108 is sandwiched between the second insulating film 1005 and the third insulating film 1008 in FIG. 10A.

The electrode 1006 and the first electrode 1007 are connected through the electrode 1106 in a contact hole formed in the insulating film 1108.

The insulating film 1108 can have the same structure as the second insulating film 1005. The electrode 1106 can have the same structure as the electrode 1006.

This embodiment can be freely implemented in combination with embodiment modes the invention and Embodiment 1.

Embodiment 3

Figure 11A:
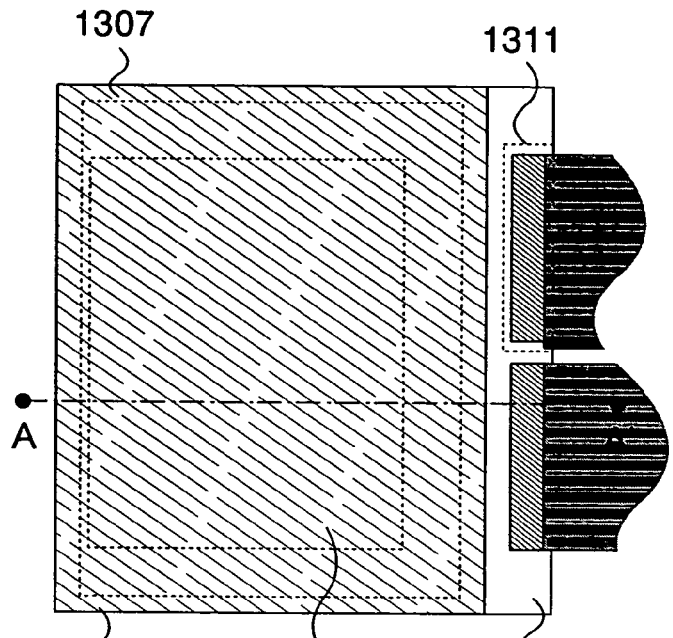
FIGS. 11A to 11C are views showing Embodiment 3.
Figure 11B:
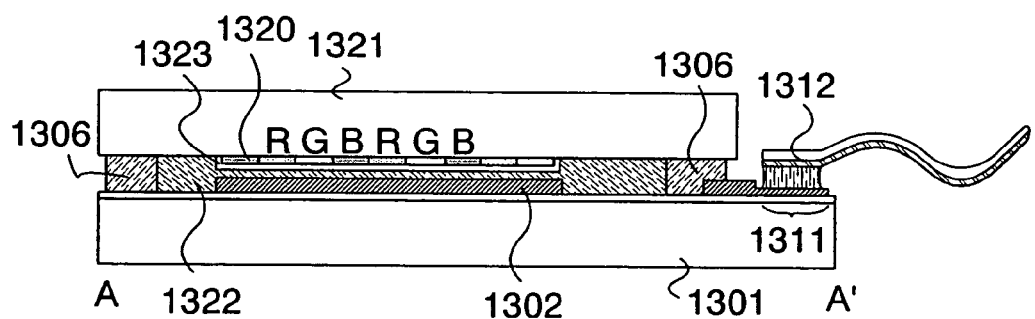
Figure 11C:
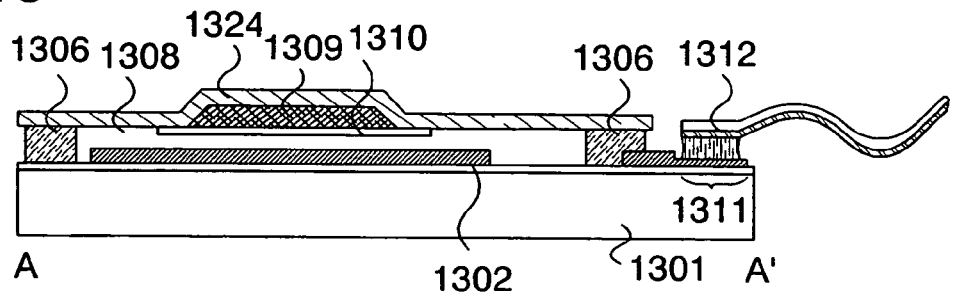

In this embodiment, description is made on a structure in which a display device is sealed with reference to FIGS. 11A to 11C. FIG. 11A shows a top plan view of a display panel formed by sealing the display device. FIGS. 11B and 11C are cross-sectional views along A-A' in FIG. 11A. FIGS. 11B and 11C are examples in which sealing is carried out in different ways.

In FIGS. 11A to 11C, a display portion 1302 including a plurality of pixels is disposed on the substrate 1301, a sealing material 1306 is provided to surround the display portion 1302, and the material for sealing 1307 is attached thereto. Structures described in Embodiment Modes of the invention or Embodiments 1 and 2 can be used for a pixel structure.

In a display panel shown in FIG. 11B, the material for sealing 1307 in FIG. 11A corresponds to a counter substrate 1321. The light-transmissive counter substrate 1321 is attached to the substrate 1301 by using the sealing material 1306 as an adhesive layer so that an enclosed space 1322 is formed by the substrate 1301, the counter substrate 1321, and the sealing material 1306. The counter substrate 1321 are provided with a color filter 1320 and a protective film 1323 for protecting the color filter 1320. Light emitted from a light-emitting element which is arranged in the display portion 1302 is extracted to the outside through the color filter 1320. The enclosed space 1322 is filled with an inert resin or liquid. Note that a light-transmissive resin into which a moisture absorbing material is dispersed may be used as a resin for filling the enclosed space 1322. Further, by using the same material for the sealing material 1306 and a material for filing the enclosed space 1322, adhesion of the counter substrate 1321 and sealing of the display portion 1302 may be carried out at once.

In a display panel shown in FIG. 11C, the material for sealing 1307 in FIG. 11A corresponds to a material for sealing 1324. The material for sealing 1324 is attached to the substrate 1301 by using the sealing material 1306 as an adhesive layer so that an enclosed space 1308 is formed by the substrate 1301, the sealing material 1306, and the material for sealing 1324. A moisture absorbing agent 1309 is provided in a depressed portion of the material for sealing 1324 in advance so as to maintain a clean atmosphere by absorbing moisture, oxygen, and the like, which leads to prevent a light-emitting element from being deteriorated. The depressed portion is covered with a meshed cover material 1310. Although atmosphere and moisture pass through the cover material 1310, they do not pass through the moisture absorbing agent 1309. Note that the enclosed space 1308 may be filled with nitrogen or noble gas such as argon. The enclosed space 1308 can also be filled with a resin or liquid as far as it is inert.

An input terminal portion 1311 for transmitting a signal to the display portion 1302 and the like is provided over the substrate 1301, and a signal such as a video signal is transmitted to the input terminal portion 1311 through an FPC (Flexible Printed Circuit) 1312. In the input terminal portion 1311, a wire formed over the substrate 1301 and a wire provided in the FPC 1312 are electrically connected to each other by using a resin in which conductive materials are dispersed (anisotropic conductive resin: ACF).

A driver circuit for inputting a signal to the display portion 1302 may be formed over the substrate 1301 over which the display portion 1302 is formed. The driver circuit for inputting a signal to the display portion 1302 may be formed of an IC chip and connected onto the substrate 1301 by COG (Chip On Glass). The IC chip may be disposed over the substrate 1301 by using TAB (Tape Auto Bonding) and a printed substrate.

This embodiment can be freely implemented in combination with embodiment modes of the invention, and Embodiments 1 and 2.

Embodiment 4

The invention can be applied to a display module on which a circuit for inputting a signal to a display panel is mounted.

Figure 12:
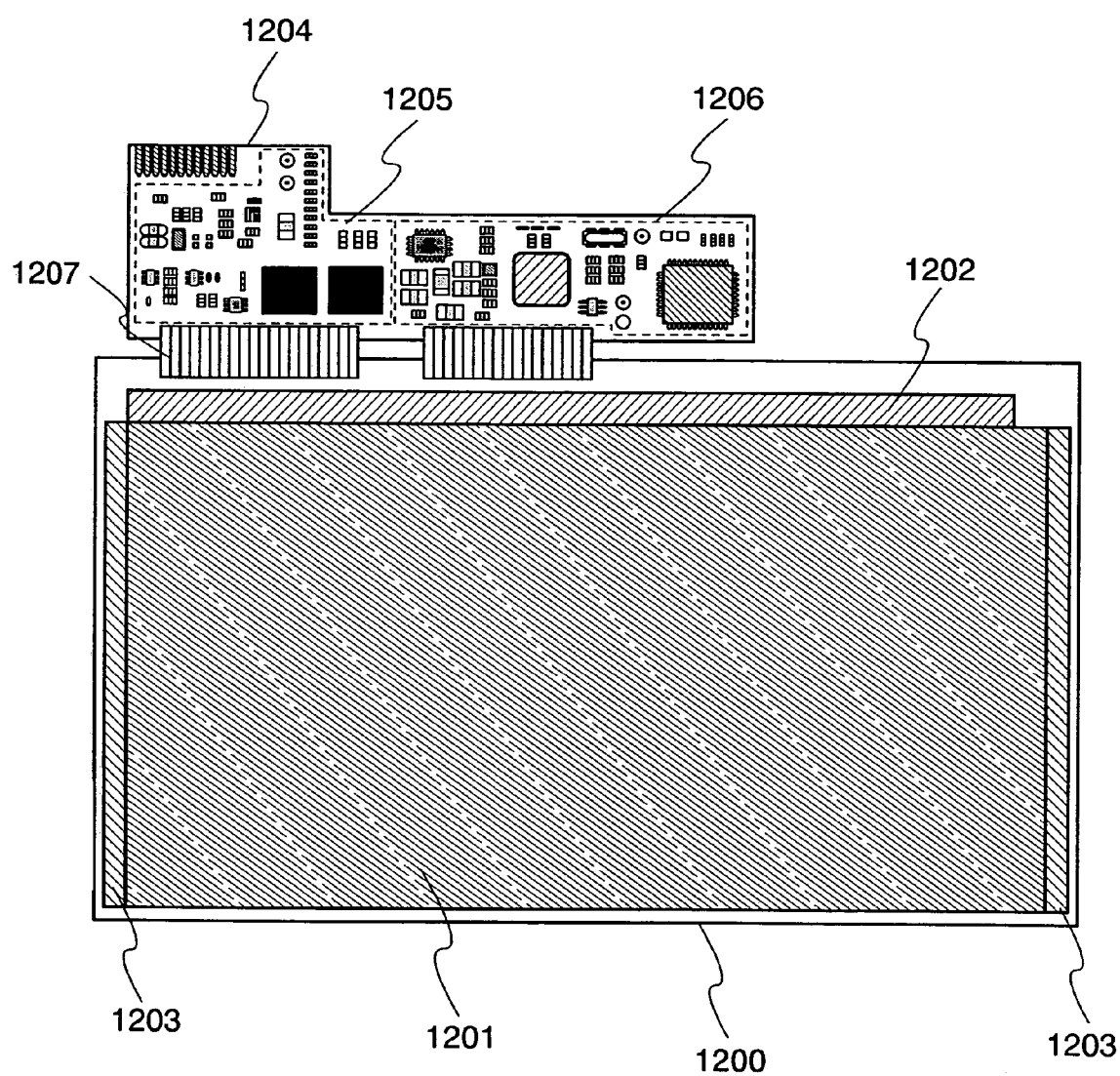
FIG. 12 is a view showing Embodiment 4.

FIG. 12 shows a display module formed by combining a display panel 1200 and a circuit substrate 1204.

FIG. 12 shows an example in which a control circuit 1205, a signal dividing circuit 1206, and the like are formed over the circuit substrate 1204. Circuits formed over the circuit substrate 1204 are not limited to them. Any circuit may be formed as far as it is a circuit which generates a signal for controlling a display panel.

A signal outputted from these circuits which are formed over the circuit substrate 1204 is inputted to the display panel 1200 through a connect wire 1207.

The display panel 1200 includes a display portion 1201, a source signal line driver circuit 1202, and a gate select line driver circuit 1203. The display panel 1200 has the same structure as that described in Embodiment 2 and the like. FIG. 12 shows an example in which the source signal line driver circuit 1202 and the gate select line driver circuit 1203 are formed over the same substrate as the display portion 1201. However, the display module of the invention is not limited to this. Alternatively, only the gate select line driver circuit may be formed over the same substrate as the display portion, and the source signal line driver circuit may be formed over the circuit substrate. Both the source line driver circuit and the gate select line driver circuit may be formed over the circuit substrate.

A display portion of various electronic appliances can be formed by incorporating such display modules.

This embodiment can be freely implemented in combination with embodiment modes of the invention, and Embodiments 1 to 3.

Embodiment 5

As examples of an electronic appliance using the display module of the invention, there are cameras such as a video camera and a digital camera, a goggle type display (head mounted display), a navigation system, an audio reproducing device (car audio component stereo, audio component stereo or the like), a personal computer, a game machine, a portable information terminal (mobile computer, mobile phone, mobile game machine, electronic book, or the like), an image reproducing device having a recording medium (specifically, a device for reproducing a recording medium such as a digital versatile disk (DVD) and having a display for displaying the reproduced image), and the like. A display screen of a portable information terminal is often seen obliquely so that a wide viewing angle is regarded as important. Therefore, specifically, a self light-emitting display device is desirably used for a portable information terminal. The invention is specifically effective for a portable information appliance in which reduction of power consumption is an important object.

FIGS. 13A to 13H show specific examples of these electronic appliances. Note that electronic appliances shown here are only illustrative, therefore, the invention is not limited to these applications.

Figure 13A:
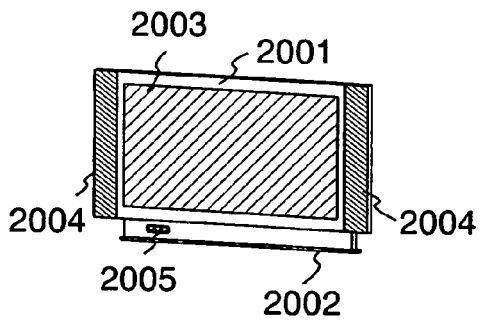
FIGS. 13A to 13H are views showing electronic appliances using the invention.

FIG. 13A is a display device which includes a housing 2001, a supporting base 2002, a display portion 2003, speaker portions 2004, a video inputting terminal 2005, and the like. The display module of the invention can be used for the display portion 2003. Note that the display device includes all display devices for displaying information such as for a personal computer, receiving television broadcasting, and displaying an advertisement.

Figure 13B:
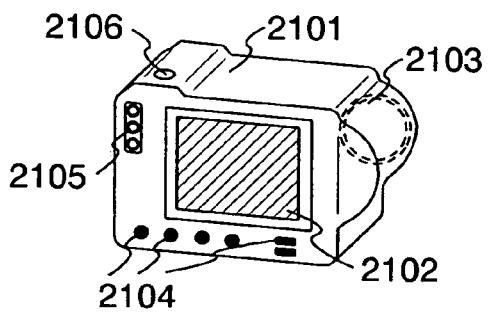

FIG. 13B is a digital camera, which includes a main body 2101, a display portion 2102, an image receiving portion 2103, operating keys 2104, an external connection port 2105, a shutter 2106, and the like. The display module of the invention can be used for the display portion 2102.

Figure 13C:
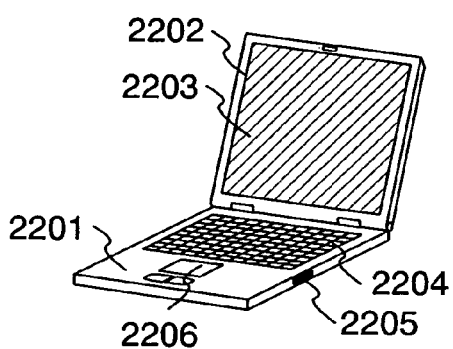

FIG. 13C is a personal computer, which includes a main body 2201, a housing 2202, a display portion 2203, a keyboard 2204, an external connection port 2205, a pointing pad 2206, and the like. The display module of the invention can be used for the display portion 2203.

Figure 13D:
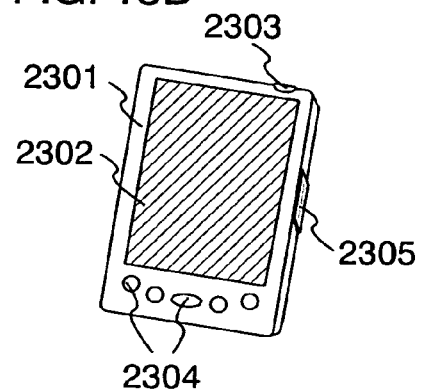

FIG. 13D is a mobile computer, which includes a main body 2301, a display portion 2302, a switch 2303, operating keys 2304, an infrared port 2305, and the like. The display module of the invention can be used for the display portion 2302.

Figure 13E:
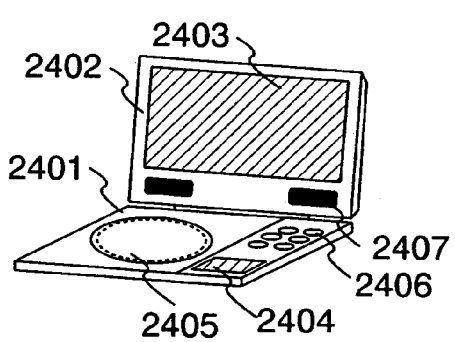

FIG. 13E is a portable image reproducing device provided with a recording medium (specifically, a DVD reproducing device), which includes a main body 2401, a housing 2402, a display portion A 2403, a display portion B 2404, a recording medium (DVD or the like) reading portion 2405, an operating key 2406, a speaker portion 2407, and the like. The display portion A 2403 mainly displays image data, and the display portion B 2404 mainly displays text data. The display module of the invention can be used for the display portions A 2403 and B 2404. Note that an image reproducing device provided with a recording medium includes a home-use game machine and the like.

Figure 13F:
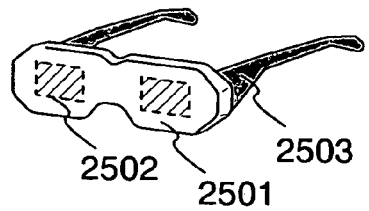

FIG. 13F is a goggle type display (head mounted display), which includes a main body 2501, a display portion 2502, and an arm portion 2503. The display module of the invention can be used for the display portion 2502.

Figure 13G:
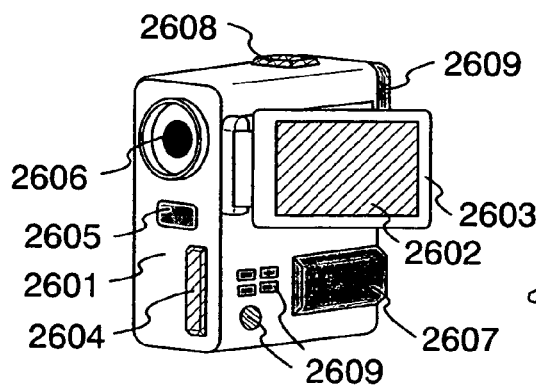

FIG. 13G is a video camera, which includes a main body 2601, a display portion 2602, a housing 2603, an external connection port 2604, a remote control receiving portion 2605, an image receiving portion 2606, a battery 2607, an audio inputting portion 2608, operating keys 2609, and the like. The display module of the invention can be used for the display portion 2602.

Figure 13H:
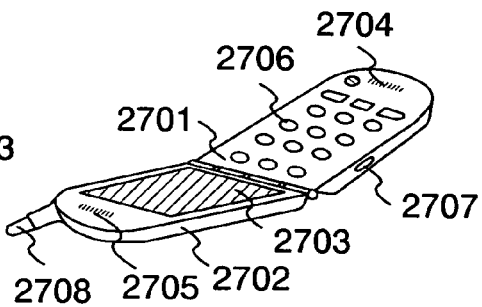

FIG. 13H is a mobile phone, which includes a main body 2701, a housing 2702, a display portion 2703, an audio inputting portion 2704, an audio outputting portion 2705, an operating key 2706, an external connection port 2707, an antenna 2708, and the like. The display module of the invention can be used for the display portion 2703.

Note that if the luminance of light-emitting elements becomes higher in the future, the light including outputted image data can be expanded and projected by a lens and the like to be used for a front or rear projector.

Furthermore, the aforementioned electronic appliances are becoming to be used for displaying data distributed through a telecommunication line such as the Internet, a CATV (cable television system), and in particular for displaying moving image data. The display modules of the invention are suitable for displaying moving images since the response of the light emitting material is extremely quick.

In a display device of the invention, a portion that emits light consumes power. Therefore, it is desirable to display data such that the light emitting portion is as small as possible. Accordingly, in the case where a display module is used for a display portion that mainly displays text data, such as a portable information terminal, in particular, a mobile phone or an audio reproducing device, it is desirable to drive so that light emitting portions display text data while non-light-emitting portions serve as the background.

As described above, the application range of the invention is so wide that the invention can be applied to electronic appliances of various fields.

This embodiment can be freely implemented in combination with embodiment modes of the invention, and Embodiment 1 to 4.

This application is based on Japanese Patent Application serial no. 2005-024616 filed in Japan Patent Office on 31 Jan. 2005, the entire contents of which are hereby incorporated by reference.

What is claimed is:

1. A driving method of a display device comprising a wire and a plurality of pixels each of which includes a first transistor, a second transistor, a light-emitting element including a pair of electrodes, and a capacitor including a pair of electrodes,
wherein the wire is electrically connected to one of a source electrode and a drain electrode of the first transistor,
wherein the other of the source electrode and the drain electrode of the first transistor is electrically connected to one electrode of the light-emitting element, and to one of a source electrode and a drain electrode of the second transistor,
wherein the other of the source electrode and the drain electrode of the second transistor is electrically connected to the other electrode of the light-emitting element,
wherein gate electrodes of the first and second transistors are electrically connected to one electrode of the capacitor, and
wherein the other electrode of the capacitor is electrically connected to the wire, and
the driving method comprising:
setting a potential difference between the pair of electrodes of the light-emitting element to be lower than a threshold voltage of the light-emitting element so that the light-emitting element emits no light by turning the second transistor on in the case where the source electrode and the drain electrode of the first transistor is short-circuited and a potential of the wire is applied to the one electrode of the light-emitting element.

2. The driving method of a display device according to claim 1, wherein the first transistor and the second transistor are different conductive type.

3. The driving method of a display device according to claim 1, wherein the first transistor operates in a saturation region.

4. The driving method of a display device according to claim 1, wherein a luminance of the light-emitting element is controlled by an analog gray scale method.

5. The driving method of a display device according to claim 1, wherein a luminance of the light-emitting element is controlled by a digital gray scale method.

6. A driving method of a display device comprising a first wire, a second wire, and a plurality of pixels each of which includes a first transistor, a second transistor, a light-emitting element including a pair of electrodes, and a capacitor including a pair of electrodes,
wherein the first wire is electrically connected to one of a source electrode and a drain electrode of the first transistor,
wherein the other of the source electrode and the drain electrode of the first transistor is electrically connected to one electrode of the light-emitting element, and to one of a source electrode and a drain electrode of the second transistor,
wherein the other of the source electrode and the drain electrode of the second transistor is electrically connected to the second wire,
wherein gate electrodes of the first and second transistors are electrically connected to one electrode of the capacitor, and
wherein the other electrode of the capacitor is electrically connected to the first wire, and
the driving method comprising:
connecting electrically the second wire to the one electrode of the light-emitting element by turning the second transistor on in the case where a source electrode and a drain electrode of the first transistor is short-circuited and a potential of the first wire is applied to the one electrode of the light-emitting element, and
setting a potential difference between the pair of electrodes of the light-emitting element to be lower than a threshold voltage of the light-emitting element so that the light-emitting element emits no light.

7. The driving method of a display device according to claim 6, wherein the first transistor and the second transistor are different conductive type.

8. The driving method of a display device according to claim 6, wherein the first transistor operates in a saturation region.

9. The driving method of a display device according to claim 6, wherein a luminance of the light-emitting element is controlled by an analog gray scale method.

10. The driving method of a display device according to claim 6, wherein a luminance of the light-emitting element is controlled by a digital gray scale method.

11. A driving method of a display device comprising a first wire, a second wire, a third wire, and a plurality of pixels each of which includes a first transistor, a second transistor, a third transistor, a capacitor including a pair of electrodes, and a light-emitting element including a pair of electrodes,
wherein the first wire is electrically connected to one of a source electrode and a drain electrode of the first transistor,
wherein the other of the source electrode and the drain electrode of the first transistor is electrically connected to one electrode of the light-emitting element, and to one of a source electrode and a drain electrode of the second transistor,
wherein the other of the source electrode and the drain electrode of the second transistor is electrically connected to the other electrode of the light-emitting element,
wherein gate electrodes of the first and second transistors are electrically connected to one electrode of the capacitor, and to one of a source electrode and a drain electrode of the third transistor,
wherein the other electrode of the capacitor is electrically connected to the first wire, and the other of the source electrode and the drain electrode of the third transistor is electrically connected to the second wire, and wherein a gate electrode of the third transistor is electrically connected to the third wire, and the driving method comprising:

turning the third transistor on by applying a potential of the third wire to the third transistor in the case where the source electrode and the drain electrode of the first transistor is short-circuited and a potential of the first wire is applied to the one electrode of the light-emitting element, turning the second transistor on by applying a potential of the second wire to the second transistor, and setting a potential difference between the pair of electrodes of the light-emitting element to be lower than a threshold voltage of the light-emitting element so that the light-emitting element emits no light.

12. The driving method of a display device according to claim 11, wherein the first transistor and the second transistor are different conductive type.

13. The driving method of a display device according to claim 11, wherein the first transistor operates in a saturation region.

14. The driving method of a display device according to claim 11, wherein a luminance of the light-emitting element is controlled by an analog gray scale method.

15. The driving method of a display device according to claim 11, wherein a luminance of the light-emitting element is controlled by a digital gray scale method.

16. A driving method of a display device comprising a first wire, a second wire, a third wire, a fourth wire, and a plurality of pixels each of which includes a first transistor, a second transistor, a third transistor, a capacitor including a pair of electrodes, and a light-emitting element including a pair of electrodes, wherein the first wire is electrically connected to one of a source electrode and a drain electrode of the first transistor, wherein the other of the source electrode and the drain electrode of the first transistor is electrically connected to one electrode of the light-emitting element, and to one of a source electrode and a drain electrode of the second transistor, wherein the other of the source electrode and the drain electrode of the second transistor is electrically connected to the fourth wire, wherein gate electrodes of the first transistor and the second transistor are electrically connected to one electrode of the capacitor, and electrically connected to one of a source electrode and a drain electrode of the third transistor, wherein the other electrode of the capacitor is electrically connected to the first wire, wherein the other of the source electrode and the drain electrode of the third transistor is connected to the second wire, and wherein a gate electrode of the third transistor is electrically connected to the third wire, and the driving method comprising:

turning the third transistor on by applying a potential of the third wire to the third transistor in the case where the source electrode and the drain electrode of the first transistor is short-circuited and a potential of the first wire is applied to the one electrode of the light-emitting element, turning the second transistor on by applying a potential of the second wire to the second transistor, connecting electrically the fourth wire to the one electrode of the light-emitting element, and setting a potential difference between the pair of electrodes of the light-emitting element to be lower than a threshold voltage of the light-emitting element so that the light-emitting element emits no light.

17. The driving method of a display device according to claim 16, wherein the first transistor and the second transistor are different conductive type.

18. The driving method of a display device according to claim 16, wherein the first transistor operates in a saturation region.

19. The driving method of a display device according to claim 16, wherein a luminance of the light-emitting element is controlled by an analog gray scale method.

20. The driving method of a display device according to claim 16, wherein a luminance of the light-emitting element is controlled by a digital gray scale method.

* * * * *